(12) United States Patent
Fujiwara et al.

(10) Patent No.: US 10,991,606 B2
(45) Date of Patent: Apr. 27, 2021

(54) PURGE STOCKER

(71) Applicant: Murata Machinery, Ltd., Kyoto (JP)

(72) Inventors: Yoshiaki Fujiwara, Ise (JP); Koichi Sano, Ise (JP); Mitsuya Tokumoto, Inuyama (JP)

(73) Assignee: Murata Machinery, Ltd., Kyoto (JP)

( * ) Notice: Subject to any disclaimer, the term of this patent is extended or adjusted under 35 U.S.C. 154(b) by 0 days.

(21) Appl. No.: 16/473,800

(22) PCT Filed: Dec. 8, 2017

(86) PCT No.: PCT/JP2017/044163
§ 371 (c)(1),
(2) Date: Jun. 26, 2019

(87) PCT Pub. No.: WO2018/150698
PCT Pub. Date: Aug. 23, 2018

(65) Prior Publication Data
US 2019/0326133 A1    Oct. 24, 2019

(30) Foreign Application Priority Data

Feb. 20, 2017 (JP) .............................. JP2017-029122

(51) Int. Cl.
*H01L 21/673* (2006.01)
*G06Q 10/08* (2012.01)
(Continued)

(52) U.S. Cl.
CPC ......... *H01L 21/673* (2013.01); *G06Q 10/087* (2013.01); *H01L 21/67766* (2013.01); *H01L 21/67769* (2013.01); *H05K 13/021* (2013.01)

(58) Field of Classification Search
CPC ......... H01L 21/67766; H01L 21/67769; H01L 21/673; H01L 21/67389; H05K 13/021;
(Continued)

(56) References Cited

U.S. PATENT DOCUMENTS

2010/0000625 A1* 1/2010 Goto ................. H01L 21/67769
141/4
2015/0000759 A1* 1/2015 Takahara .......... H01L 21/67389
137/15.04
(Continued)

FOREIGN PATENT DOCUMENTS

JP       2013-67493 A    4/2013
WO    2010/084542 A1    7/2010
(Continued)

*Primary Examiner* — Glenn F Myers
(74) *Attorney, Agent, or Firm* — DLA Piper LLP (US)

(57) ABSTRACT

A purge stocker has a plurality of shelf zones each including a plurality of purge shelves each configured to purge inside of a storage container placed thereon with purge gas. The purge stocker includes: a flow-rate adjusting unit configured to adjust the flow rate of purge gas supplied to the purge shelves for each shelf zone; a conveying device configured to convey the storage container; and a control unit configured to control conveyance of the storage container by the conveying device. When the number of scattered empty shelves is equal to or larger than a predetermined shelf count that is the number of the purge shelves included in each shelf zone, the control unit performs shelf-changing control of causing the conveying device to transfer the storage container such that an empty shelf zone in which all of the purge shelves included therein are empty is newly formed.

9 Claims, 5 Drawing Sheets

(51) Int. Cl.
*H01L 21/677* (2006.01)
*H05K 13/02* (2006.01)

(58) Field of Classification Search
CPC .... G06Q 10/087; B65G 1/137; B65G 1/1371; B65G 1/1373; B65G 1/16; B65G 1/02; B65G 1/04; B65G 1/0478
See application file for complete search history.

(56) References Cited

U.S. PATENT DOCUMENTS

| | | | |
|---|---|---|---|
| 2015/0000789 A1* | 1/2015 | Otsuka | H01L 21/67769 141/369 |
| 2015/0003942 A1* | 1/2015 | Takahara | H01L 21/67733 414/277 |
| 2017/0062243 A1* | 3/2017 | Omori | H01L 21/67389 |

FOREIGN PATENT DOCUMENTS

| WO | 2015/194255 A1 | 12/2015 |
|---|---|---|
| WO | 2017/022330 A1 | 2/2017 |

* cited by examiner

PURGE STOCKER

TECHNICAL FIELD

This disclosure relates to a purge stocker.

BACKGROUND

A purge stocker including: a plurality of purge shelves each configured to purge inside of a storage container placed thereon with purge gas; a flow-rate adjusting unit configured to adjust a flow rate of the purge gas; a conveying device configured to convey the storage container; and a control unit configured to control conveyance of the storage container by the conveying device is conventionally known (see WO 2015/194255, for example). Such a purge stocker has a plurality of shelf zones each including a plurality of purge shelves. The flow-rate adjusting unit adjusts the flow rate of purge gas supplied to the purge shelves for each shelf zone.

In such a purge stocker, it is desired that the amount of purge gas used be reduced to reduce running costs, for example.

It could therefore be helpful to provide a purge stocker that reduces the amount of purge gas to be used.

SUMMARY

We thus provide:

A purge stocker has a plurality of shelf zones each including a plurality of purge shelves each configured to purge inside of a storage container placed thereon with purge gas. The purge stocker includes: a flow-rate adjusting unit configured to adjust a flow rate of the purge gas supplied to the purge shelves for each shelf zone; a conveying device configured to convey the storage container; and a control unit configured to control conveyance of the storage container by the conveying device. When the number of scattered empty shelves is equal to or larger than a predetermined shelf count that is the number of the purge shelves included in each shelf zone, the control unit performs shelf-changing control of causing the conveying device to transfer the storage container such that an empty shelf zone in which all of the purge shelves included therein are empty is newly formed.

In the purge stocker thus configured, by performing the shelf-changing control, the empty shelf zone is newly formed. Because all of the purge shelves in this empty shelf zone are empty, the need to supply purge gas to the purge shelves can be eliminated. This allows the flow-rate adjusting unit to reduce the flow rate of purge gas supplied to the purge shelves included in the empty shelf zone. Thus, the amount of purge gas used can be reduced.

When two or more shelf zones each including a purge shelf on which a storage container has been already placed and an empty shelf are present and the total number of empty shelves included in these two or more shelf zones is equal to or larger than the predetermined shelf count, the control unit may determine that the number of scattered empty shelves is equal to or larger than the predetermined shelf count and may perform the shelf-changing control. By this configuration, it can be effectively determined that the number of scattered empty shelves is equal to or larger than the predetermined shelf count.

After having performed the shelf-changing control, the control unit may stop the supply of the purge gas to the purge shelves included in the empty shelf zone newly formed by this shelf-changing control. By this configuration, the amount of purge gas used can be further reduced.

The control unit may select, based on operation input of an operator, one of the shelf zones as a transfer destination of the storage container in the shelf-changing control, and may cause, in the shelf-changing control, the conveying device to transfer the storage container to a purge shelf included in the shelf zone selected. By this configuration, the usage rates of the purge shelves in the purge stocker can be controlled.

The control unit may change the shelf zones for a transfer destination of the storage container in the shelf-changing control in a predetermined order. By this configuration, some of the purge shelves can be prevented from being more frequently used, and thus the frequency of maintenance operation can be reduced.

The control unit may cause the conveying device to load a storage container, which is to be newly loaded, preferentially onto an empty shelf in a shelf zone including a purge shelf on which a storage container has been already placed among the shelf zones. By this configuration, the storage container can be newly loaded such that empty shelves are less likely to be scattered in the purge stocker, and the shelf-changing control can be performed less frequently, whereby the frequency with which the conveying device is operated can be reduced.

The purge stocker may include a plurality of shelf groups each including a plurality of the shelf zones adjacent to one another. When the number of empty shelves scattered in one certain shelf group among the shelf groups is equal to or larger than the predetermined shelf count, the control unit may cause the conveying device to transfer the storage container between a plurality of purge shelves in this one shelf group such that the empty shelf zone is newly formed in this one shelf group. By this configuration, movement of the conveying device can be reduced more than when the storage container is transferred between the shelf groups.

The purge stocker may include a plurality of shelf groups each including a plurality of the shelf zones adjacent to one another. When the number of empty shelves scattered in first and second shelf groups that are two certain shelf groups among the shelf groups is equal to or larger than the predetermined shelf count, the control unit may cause the conveying device to transfer the storage container from a purge shelf in either one of the first and second shelf groups to a purge shelf in the other thereof such that the empty shelf zone is newly formed in the either one of the first and second shelf groups. By this configuration, the empty shelf zone can be formed more easily than when the storage container is transferred between the purge shelves in one of the shelf groups.

The control unit may perform the shelf-changing control when the number of scattered empty shelves is equal to or larger than the predetermined shelf count at at least any one execution start timing among specified date and time, time when the storage container is unloaded, and time when an execution trigger is input by an operator. By this configuration, the shelf-changing control can be performed at effective timing.

We thus provide a purge stocker that enables the amount of purge gas used to be reduced.

Reference Signs List 1 purge stocker
7A purge shelf
9 crane (conveying device)
10 control unit/controller
43 MFC (flow-rate adjusting unit)
50 stocker controller
60 crane controller
70 purge controller
F storage container
G shelf group
G1 shelf group (first shelf group)
G2 shelf group (second shelf group)
Z, Z1 to Z7 shelf zone
ZE empty shelf zone

DETAILED DESCRIPTION

One example will now be described with reference to the drawings. In the description of the drawings, like elements are designated by like reference signs, and duplicate descriptions are omitted. The scale in the drawings does not necessarily coincide with the size of a described object.

Figure 1:
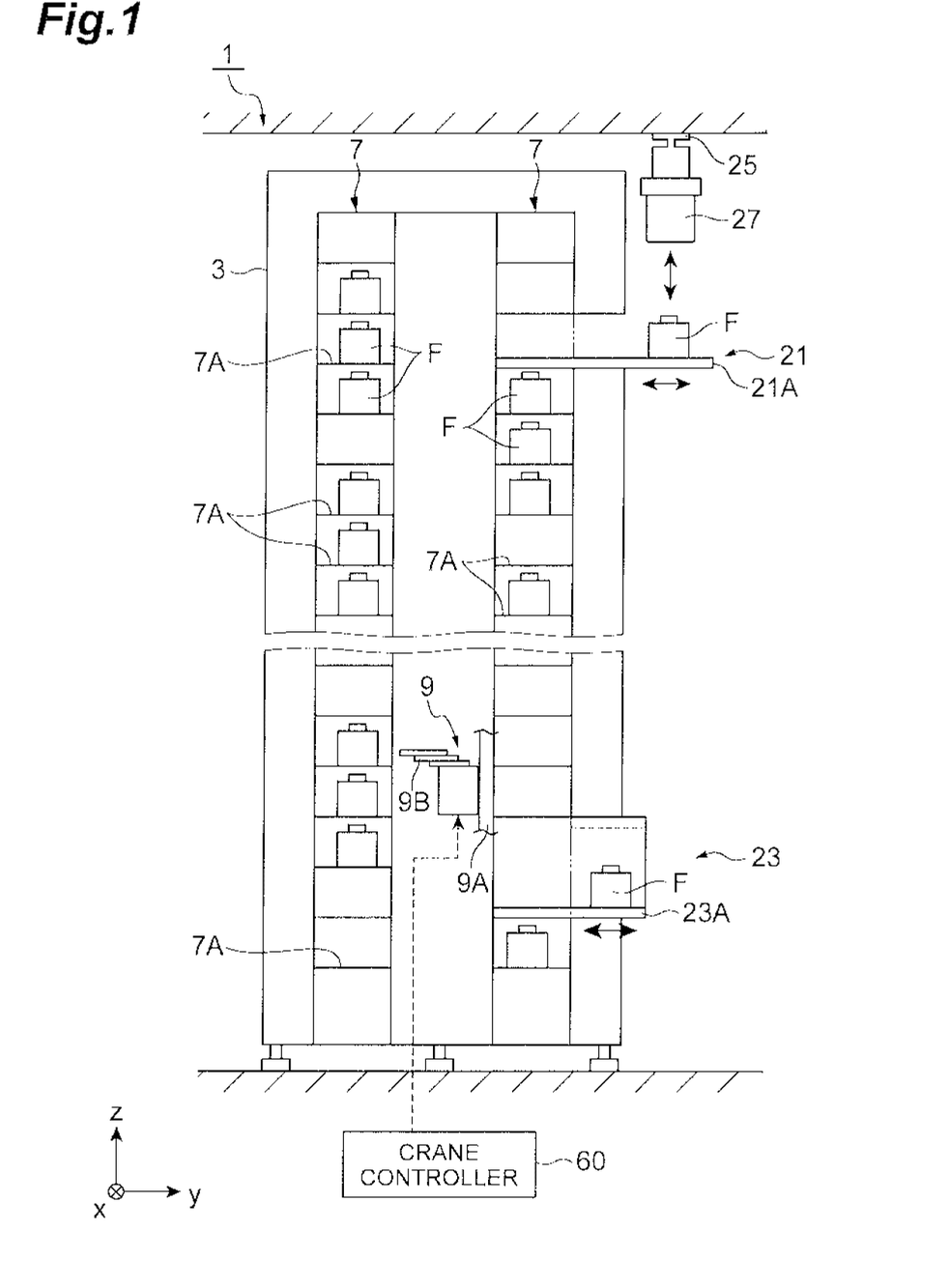
FIG. 1 is a side view illustrating a purge stocker according to one example.

As depicted in FIG. 1, a purge stocker 1 purges inside of a storage container F with purge gas, and serves as a stocker storing a plurality of storage containers F. Each storage container F is a reticle pod or a front opening unified pod (FOUP) storing an object to be stored such as a semiconductor wafer or a glass substrate. As the purge gas, for example, nitrogen gas or air is used. The purge stocker 1 is installed in a clean room, for example. The purge stocker 1 mainly includes a partition 3, racks 7, a crane (conveying device) 9, an overhead hoist transfer (OHT) port 21, and a manual port 23.

The partition 3 is a plate covering the purge stocker 1. Inside the partition 3, a storage area for storing the storage containers F is formed. The racks 7 are parts in which the storage containers F are stored. The racks 7 are provided in one or a plurality of rows (two rows in this example) in the storage area. Each rack 7 extends in a certain direction x. Two adjacent racks 7 and 7 are disposed parallel to each other to be opposed in a direction y. In each rack 7, a plurality of purge shelves 7A on which the respective storage containers F are placed to be stored are formed along the certain direction x and the vertical direction z. The purge shelves 7A are disposed to be aligned in a plurality along the vertical direction z, and are also disposed to be aligned in a plurality along the certain direction x.

The crane 9 is a conveying device configured to bring a storage container F onto and out from a purge shelf 7A, and also move a storage container F between purge shelves 7A.

The crane 9 is disposed in an area sandwiched between the opposed racks 7 and 7. The crane 9 moves on a traveling rail (not depicted) installed on a floor along the certain direction x in which the racks 7 extend. The crane 9 includes a guide rail 9A extending in the vertical direction z and a platform 9B configured to be movable up and down along the guide rail 9A. Conveyance of the storage containers F by the crane 9 is controlled by a crane controller 60 included in a control unit 10 described later.

The storage containers F are brought into and out from the purge stocker 1 through the OHT port 21 and the manual port 23. The OHT port 21 is a port where a storage container F is transferred between the purge stocker 1 and an overhead hoist transfer (OHT) 27 configured to travel on a traveling rail 25 installed on a ceiling. The OHT port 21 has a conveyor 21A configured to convey a storage container F. The manual port 23 is a port where a storage container F is transferred between the purge stocker 1 and an operator. The manual port 23 has a conveyor 23A configured to convey a storage container F.

Figure 2:
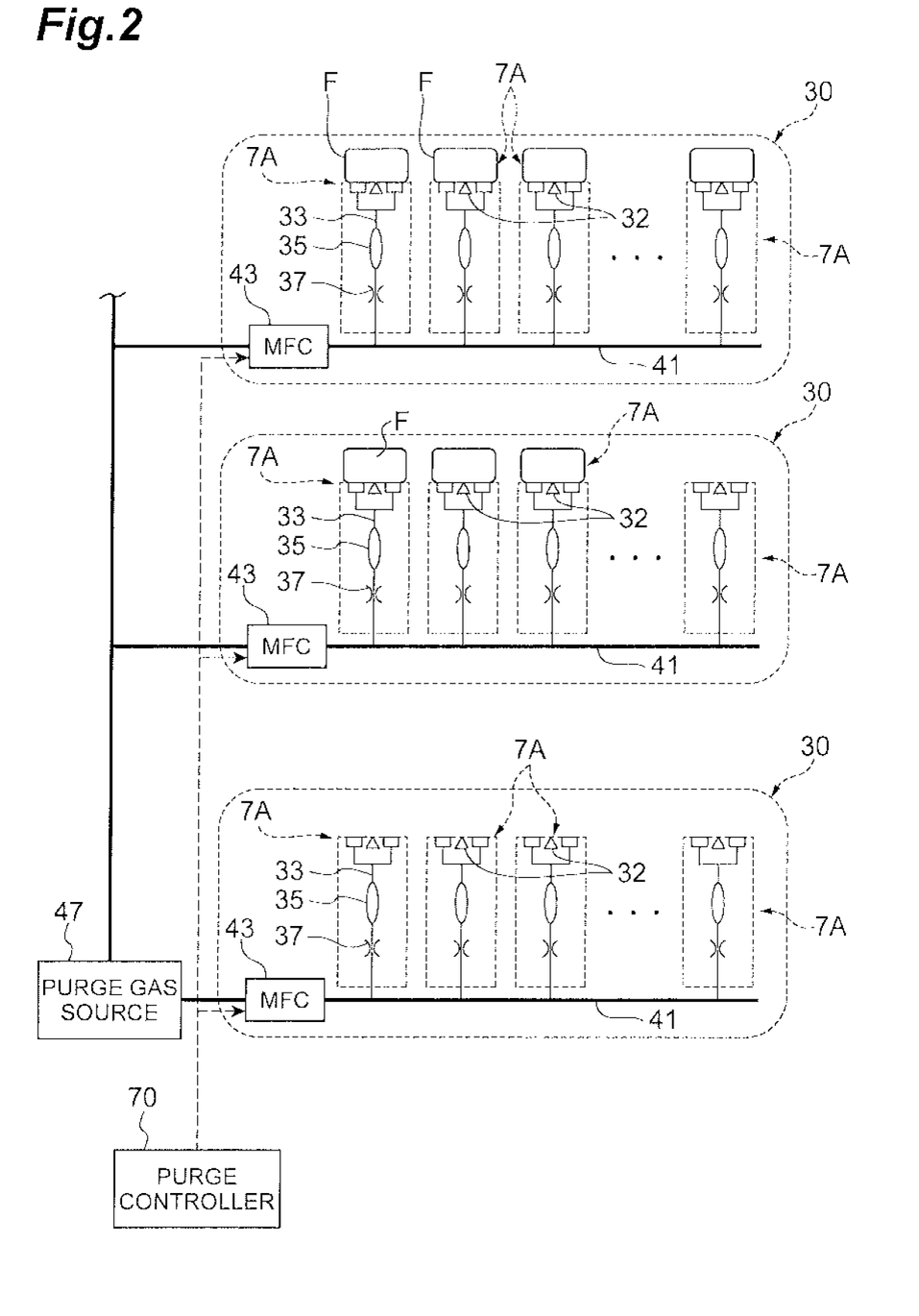
FIG. 2 is a schematic diagram illustrating a configuration of purge units of the purge stocker in FIG. 1.

The purge stocker 1 includes a plurality of purge units 30 as depicted in FIG. 2. The purge units 30 each include N (a plurality of) purge shelves 7A, N supply pipes 33, a main pipe 41 connected to the N supply pipes 33, and a mass flow controller (MFC) (flow-rate adjusting unit) 43 configured to adjust the flow rate of purge gas in the main pipe 41. To each purge unit 30, purge gas is supplied from a purge gas source 47. The purge gas source 47 is a tank configured to store purge gas.

Figure 3:
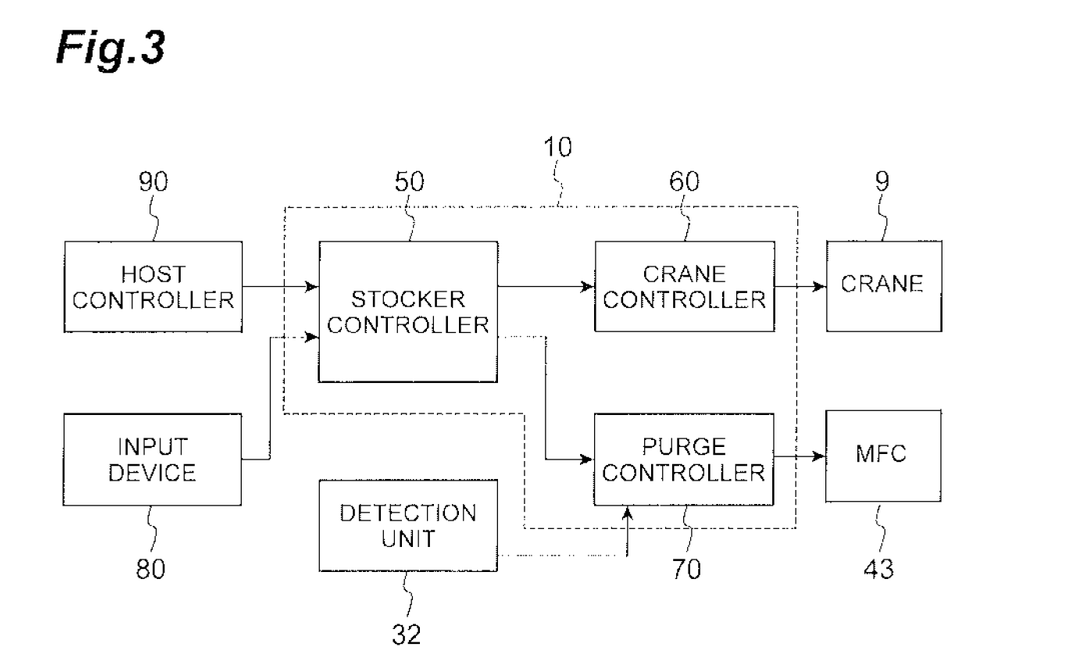
FIG. 3 is a block diagram illustrating a configuration of a control system of the purge stocker in FIG. 1.

A storage container F is placed onto each purge shelf 7A. The purge shelf 7A purges inside of the storage container F placed thereon with purge gas. Each purge shelf 7A is provided with a detection unit/detector 32 configured to detect that a storage container F is placed on the purge shelf 7A. As the detection unit 32, an optical sensor or a contact sensor, for example, can be used. After having detected that a storage container F is placed on the purge shelf 7A, the detection unit 32 outputs container placement information that is information on this placement to a purge controller 70 included in the control unit 10 described later as shown in FIG. 3. Herein, the detection unit 32 may be omitted.

In the following description, a group of purge shelves 7A included in one purge unit 30 is called "shelf zone." Herein, as exemplified in FIG. 4, a series of purge shelves 7A aligned in a row along the vertical direction is considered as one shelf zone Z. A plurality of adjacent shelf zones Z (i.e., a group of shelf zones Z that form one group) are called "shelf group G." In other words, the purge stocker 1 includes a plurality of shelf groups G, each of the shelf groups G includes a plurality of shelf zones Z, and each of the shelf zones Z includes a plurality of purge shelves 7A.

Referring back to FIG. 2, each supply pipe 33 supplies purge gas to a storage container F placed on the corresponding purge shelf 7A. A nozzle is formed on the distal end of the supply pipe 33. With the distal end of the supply pipe 33 being closely attached to a supply port of the storage container F, purge gas is supplied into the storage container F. The supply pipe 33 is provided with a particle filter 35 and an orifice 37. The particle filter 35 is a filter capable of collecting dust (particles). The particle filter 35 may be provided as necessary. The orifice 37 adjusts the flow rate of purge gas supplied from the corresponding main pipe 41 such that the purge gas is evenly distributed among a plurality of supply pipes 33.

The main pipe 41, to which the N supply pipes 33 are connected, supplies purge gas to the N supply pipes 33. The main pipe 41 is provided with the MFC 43. The MFC 43 measures the mass flow rate of purge gas flowing through the main pipe 41 to control the flow rate. Specifically, each MFC 43 of the corresponding purge unit 30 adjusts the flow rate of purge gas supplied to a plurality of purge shelves 7A for the corresponding shelf zone Z. The flow rate control in the MFC 43 is controlled by the purge controller 70 included in the control unit 10 described later.

As depicted in FIG. 3, the purge stocker 1 includes the control unit/controller 10 including a stocker controller 50, the crane controller 60, and the purge controller 70. The purge stocker 1 includes an input device 80. Each of the controllers 50, 60, and 70 is an electronic processing unit/ processor including a central processing unit (CPU), a read only memory (ROM), and a random access memory (RAM), for example. Each of the controllers 50, 60, and 70 performs various controls by loading a program stored in the ROM into the RAM for the CPU to execute the program. Herein, each of the controllers 50, 60, and 70 may include a plurality of electronic processing units. At least two of the controllers 50, 60, and 70 may be included in a single electronic processing unit.

The stocker controller 50 included in the control unit 10 controls the entire purge stocker 1. The stocker controller 50 connects to the crane controller 60 and the purge controller 70. The stocker controller 50 controls the crane controller 60 and the purge controller 70. The stocker controller 50 outputs a conveyance command to the crane controller 60 on the basis of information containing at least either one of loading schedule information (information on a storage container F scheduled to be loaded) input from a host controller 90 and operation input information corresponding to operation input of an operator, which is input with the input device 80.

When the number of empty shelves scattered in the purge stocker 1 is equal to or larger than a predetermined shelf count (the number of purge shelves 7A included in one shelf zone Z), the stocker controller 50 performs shelf-changing control. The predetermined shelf count is a value set in advance. The predetermined shelf count herein is the number of a series of purge shelves 7A aligned in a row in the vertical direction. The empty shelves are purge shelves 7A on which a storage container F is not placed. The shelf-changing control causes the crane 9 to transfer a storage container F such that an empty shelf zone in which all of the purge shelves 7A included therein are empty is newly formed. The shelf-changing control is also called defragmentation control. The defragmentation herein means relocation of storage containers F.

When the number of empty shelves scattered in the purge stocker 1 is equal to or larger than the predetermined shelf count at at least any one execution start timing among specified date and time, time when a storage container F is unloaded, and time when an execution trigger is input by the operator, the stocker controller 50 performs the shelf-changing control. The execution start timing is selected in advance by the operator via the input device 80. The specified date and time is a date and a time that are input or selected in advance to be set by the operator via the input device 80. For example, as the specified date and time, time B every day or on day A every week (herein, A is any given day of the week, and B is any given time) can be set. The time when an execution trigger is input by the operator is a time when an execution trigger as a command input indicating that the shelf-changing control is required to be performed is input by the operator via the input device 80. Execution of the shelf-changing control at the specified date and time is automatic execution of the shelf-changing control. Execution of the shelf-changing control at time when an execution trigger is input by the operator is manual execution of the shelf-changing control.

When two or more shelf zones Z each including a full shelf that is a purge shelf 7A on which a storage container F has been already placed (hereinafter simply called "full shelf") and an empty shelf are present and the total number of empty shelves included in these two or more shelf zones Z is equal to or larger than the predetermined shelf count, the stocker controller 50 determines that the number of empty shelves scattered in the purge stocker 1 is equal to or larger than the predetermined shelf count and performs the shelf-changing control.

The stocker controller 50 selects, as a shelf zone Z as a transfer source of a storage container F in the shelf-changing control, a shelf zone Z the serial number of which is the largest among a plurality of shelf zones Z each including a full shelf and an empty shelf. The serial number is a number assigned sequentially to each of a plurality of shelf zones Z. The stocker controller 50 causes the crane 9 to transfer a storage container F from a purge shelf 7A in the selected shelf zone Z in the shelf-changing control.

The stocker controller 50 selects, as a shelf zone Z as a transfer destination of the storage container F in the shelf-changing control, a shelf zone Z the serial number of which is the smallest among the shelf zones Z each including a full shelf and an empty shelf. The stocker controller 50 causes the crane 9 to transfer the storage container F onto a purge shelf 7A as an empty shelf in the selected shelf zone Z in the shelf-changing control.

When the number of empty shelves scattered in one certain shelf group G is equal to or larger than the predetermined shelf count, the stocker controller 50 performs intra-group shelf-changing control. The intra-group shelf-changing control is control of causing the crane 9 to transfer a storage container F between a plurality of purge shelves 7A in this one shelf group such that an empty shelf zone is newly formed in this one shelf group (details will be described later).

The stocker controller 50 selects one shelf group on which the intra-group shelf-changing control is to be performed on the basis of operation input of the operator, which is input with the input device 80. The stocker controller 50 performs the intra-group shelf-changing control of causing the crane 9 to transfer a storage container F between the purge shelves 7A included in this selected one shelf group.

When the number of empty shelves scattered in first and second shelf groups that are two certain shelf groups G is equal to or larger than the predetermined shelf count during a period in which the operation mode of the purge stocker 1 is maintenance, for example, the stocker controller 50 performs inter-group shelf-changing control. The inter-group shelf-changing control causes the crane 9 to transfer a storage container F from a purge shelf 7A in either one of the first and second shelf groups to a purge shelf 7A in the other thereof such that an empty shelf zone is newly formed in the either one of the first and second shelf groups (details will be described later).

The stocker controller 50 selects at least either one of a shelf group G as a transfer source of a storage container F and a shelf group G as a transfer destination thereof in the inter-group shelf-changing control on the basis of operation input of the operator, which is input with the input device 80. When having selected a shelf group G as the transfer source, the stocker controller 50 performs the inter-group shelf-changing control of causing the crane 9 to transfer a storage container F from a purge shelf 7A in the selected shelf group G. After having selected a shelf group G as the transfer destination, the stocker controller 50 performs the inter-group shelf-changing control of causing the crane 9 to transfer the storage container F to a purge shelf 7A included in the selected shelf group G and is empty.

When a storage container F is loaded, the stocker controller 50 causes the crane 9 to load the storage container F preferentially onto an empty shelf in a shelf zone Z including a full shelf among a plurality of shelf zones Z.

The crane controller 60 controls operation of the crane 9 on the basis of a conveyance command from the stocker controller 50 to control conveyance of the storage container F by the crane 9. The purge controller 70 controls flow-rate adjustment of purge gas performed by each MFC 43 to adjust the flow rate of purge gas supplied to a plurality of purge shelves 7A for the corresponding shelf zone Z. When the stocker controller 50 has performed the shelf-changing control, the purge controller 70 in this example reduces or stops supplying purge gas to the purge shelves 7A included in the empty shelf zone newly formed by this shelf-changing control.

The input device 80 is a device with which the operator performs various operation inputs. As the input device 80, at least any one of a touch panel, a keyboard, a mouse, for example, may be used. With the input device 80, at least any one is performed out of selective input of the execution start timing, input of the specified date and time, input of the execution trigger for manually executing the shelf-changing control, input of a shelf zone Z as a transfer destination of a storage container F in the shelf-changing control, input of a shelf group G on which the intra-group shelf-changing control is to be performed, input of a shelf group G as a transfer source or a transfer destination in the inter-group shelf-changing control. The input device 80 transmits operation input information on this input to the stocker controller 50.

Figure 4A:
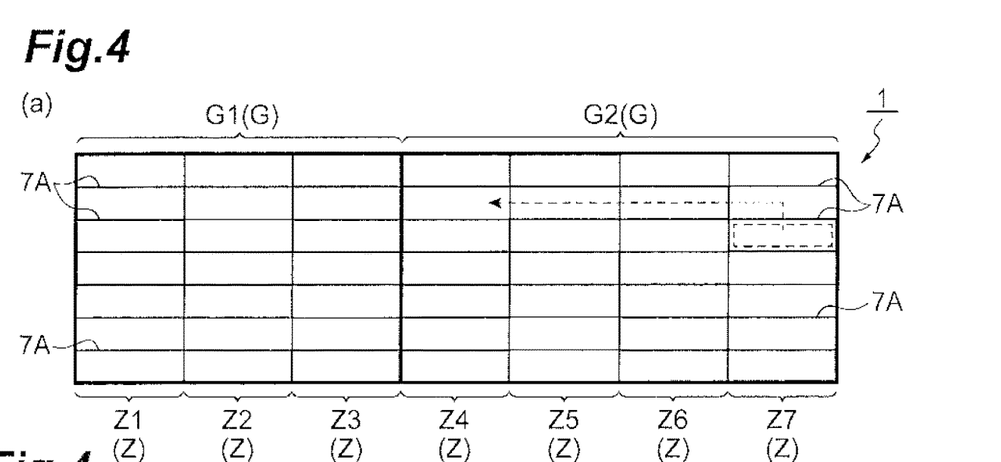
FIG. 4(a) is a diagram explaining intra-group shelf-changing control performed in the purge stocker in FIG. 1.
Figure 4B:
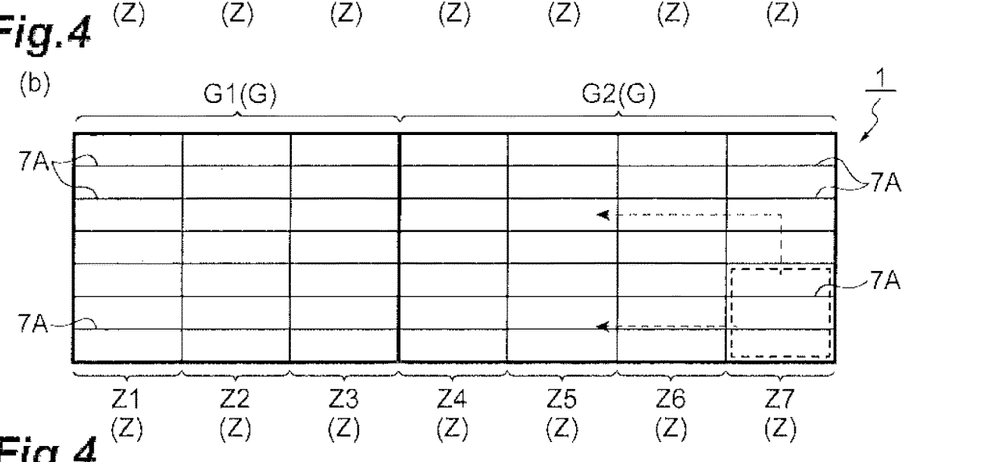
FIG. 4(b) is a diagram explaining the intra-group shelf-changing control performed in the purge stocker in FIG. 1.
Figure 4C:
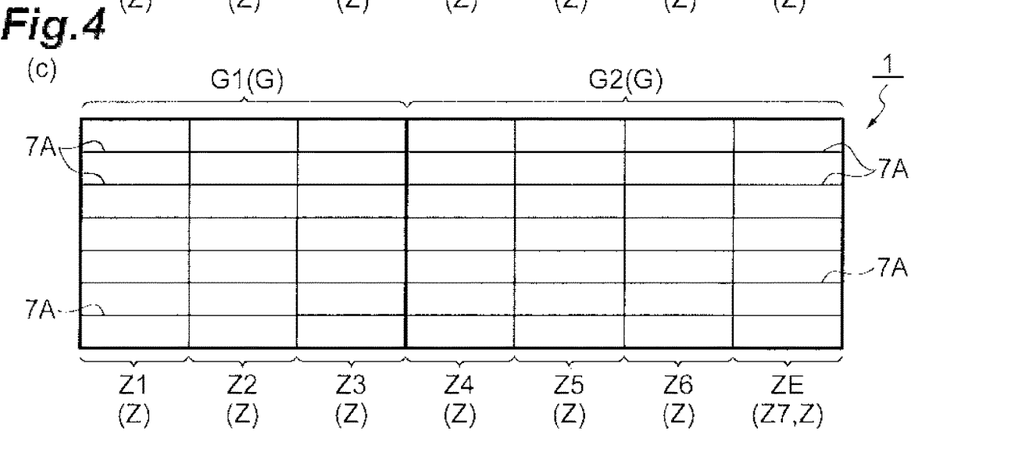
FIG. 4(c) is a diagram explaining the intra-group shelf-changing control performed in the purge stocker in FIG. 1.
Figure 5:
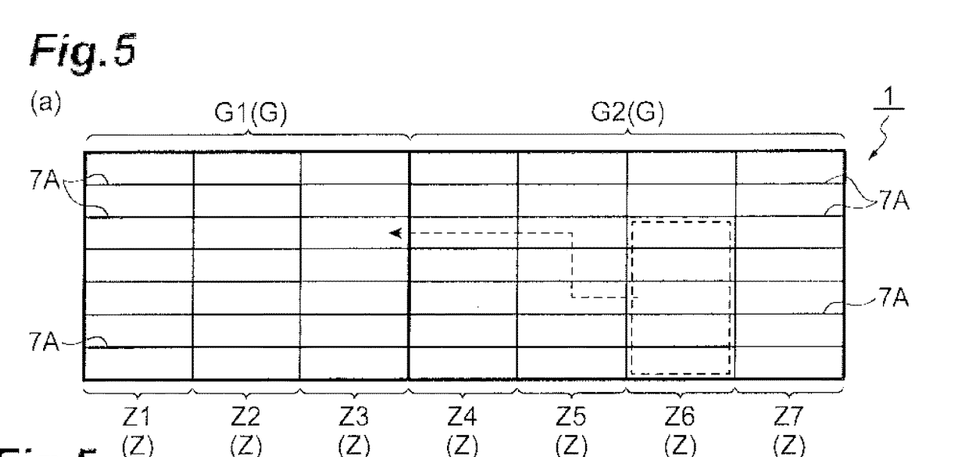
FIG. 5(a) is a diagram explaining inter-group shelf-changing control performed in the purge stocker in FIG. 1.
FIG. 5(b) is a diagram explaining the inter-group shelf-changing control performed in the purge stocker in FIG. 1.

The following describes one example of the shelf-changing control with reference to FIGS. 4 and 5. In FIGS. 4 and 5, the purge stocker 1 including two shelf groups G1 and G2 is illustrated for convenience. The shelf group G1 includes three shelf zones Z1 to Z3, and the shelf group G2 includes four shelf zones Z4 to Z7. The shelf zones Z1 to Z7 each include seven purge shelves 7A.

Intra-Group Shelf-Changing Control

An example of the intra-group shelf-changing control will be described first. In this example, the shelf groups G1 and G2 are selected as shelf groups G on which the intra-group shelf-changing control is to be performed, and the intra-group shelf-changing control is performed at specified date and time set by the operator.

When the specified date and time thus set has been reached, the stocker controller 50 determines whether the number of empty shelves scattered in each of the shelf groups G1 and G2 is equal to or larger than the predetermined shelf count. To determine whether the number of scattered empty shelves is equal to or larger than the predetermined shelf count, the stocker controller 50 determines whether two or more shelf zones Z each including a full shelf and an empty shelf are present and the total number of empty shelves included in these two or more shelf zones Z is equal to or larger than the predetermined shelf count.

As depicted in FIG. 4(*a*), in the shelf group G1, although all the shelf zones Z1 to Z3 include both a full shelf and an empty shelf, the total number of empty shelves included therein is smaller than the predetermined shelf count (seven in this illustrated example). Thus, in the shelf group G1, the intra-group shelf-changing control is not performed. By contrast, in the shelf group G2, all the shelf zones Z1 to Z3 include both a full shelf and an empty shelf and the total number of empty shelves included therein is equal to or larger than the predetermined shelf count. Thus, the stocker controller 50 performs the intra-group shelf-changing control on the shelf group G2.

Specifically, the stocker controller 50 selects, as a shelf zone Z as a transfer source of a storage container F, the shelf zone Z7 the serial number of which is the largest among the shelf zones Z4 to Z7 each including a full shelf and an empty shelf. The crane controller 60 selects, as a shelf zone Z as a transfer destination of the storage container F, the shelf zone Z4 the serial number of which is the smallest among the shelf zones Z4 to Z7. The stocker controller 50 causes the crane 9 to transfer the storage container F from a purge shelf 7A in the selected shelf zone Z7 to a purge shelf 7A in the selected shelf zone Z4 as shown in FIGS. 4(*a*) and 4(*b*).

Subsequently, transfer of a storage container F as described above is repeatedly performed. Specifically, as depicted in FIG. 4(*b*), the stocker controller 50 selects, as a shelf zone Z as a transfer source of storage containers F, the shelf zone Z7 the serial number of which is the largest among the shelf zones Z5 to Z7 each including a full shelf and an empty shelf. The stocker controller 50 selects, as a shelf zone Z as a transfer destination of the storage containers F, the shelf zone Z5 the serial number of which is the smallest among the shelf zones Z5 to Z7. The stocker controller 50 causes the crane 9 to transfer the storage containers F from purge shelves 7A in the selected shelf zone Z7 to purge shelves 7A in the selected shelf zone Z5 as shown in FIGS. 4(*b*) and 4(*c*).

Consequently, as depicted in FIG. 4(*c*), in the shelf group G2, the shelf zone Z7 that is an empty shelf zone ZE in which all of the purge shelves 7A are empty is formed. Subsequently, the purge controller 70 adjusts the corresponding MFC 43 such that the supply flow rate of purge gas flowing through the main pipe 41 of the purge unit 30 corresponding to the empty shelf zone ZE becomes zero, thereby stopping the supply of purge gas to all of the purge shelves 7A included in the empty shelf zone ZE. In the example described above, the shelf group G2 corresponds to the one certain shelf group in which the number of scattered empty shelves is equal to or larger than the predetermined shelf count.

Inter-Group Shelf-Changing Control

The following describes an example of the inter-group shelf-changing control. In this example, the shelf group G2 is selected as a shelf group G as a transfer source of a storage container F, and the shelf group G1 is selected as a shelf group G as a transfer destination of the storage container F.

When an execution trigger to manually perform the inter-group shelf-changing control is input via the input device 80 during a period in which the operation mode of the purge stocker 1 is maintenance, the stocker controller 50 determines whether the number of empty shelves scattered in the whole of the shelf groups G1 and G2 is equal to or larger than the predetermined shelf count. To determine whether the number of scattered empty shelves is equal to larger than the predetermined shelf count, the stocker controller 50 determines whether one or more shelf zones Z each including a full shelf and an empty shelf are present in each of the shelf groups G1 and G2 and the total number of empty shelves included in the one or more shelf zones Z is equal to or larger than the predetermined shelf count.

As depicted in FIG. 5(*a*), in the shelf group G1, the shelf zone Z3 includes full shelves and empty shelves. In the shelf group G2, the shelf zone Z6 includes full shelves and empty shelves. The total number of empty shelves included in the shelf zones Z3 and Z6 is equal to or larger than the predetermined shelf count (seven in the illustrated example). Thus, the stocker controller 50 performs the inter-group shelf-changing control on the shelf groups G1 and G2.

Specifically, the stocker controller 50 selects, as a shelf zone Z as a transfer source of a storage container F, a shelf zone Z the serial number of which is the largest among shelf zones Z each including a full shelf and an empty shelf in the shelf group G2. Herein, the stocker controller 50 selects the shelf zone Z6 as the transfer source. The stocker controller 50 selects, as a shelf zone Z as a transfer destination of the storage container F, a shelf zone Z the serial number of which is the smallest among shelf zones Z each including a full shelf and an empty shelf in the shelf group G1. Herein, the stocker controller 50 selects the shelf zone Z3 as the transfer destination. The stocker controller 50 causes the crane 9 to transfer storage containers F from purge shelves 7A in the shelf zone Z6 in the shelf group G2 to purge shelves 7A in the shelf zone Z3 in the shelf group G1 as shown in FIGS. 5(a) and 5(b).

Consequently, as depicted in FIG. 5(b), in the shelf group G2, the shelf zone Z6 that is an empty shelf zone ZE in which all of the purge shelves 7A are empty is formed. Subsequently, the purge controller 70 adjusts the corresponding MFC 43 such that the supply flow rate of purge gas flowing through the main pipe 41 of the purge unit 30 corresponding to the empty shelf zone ZE becomes zero, thereby stopping supply of purge gas to all of the purge shelves 7A included in the empty shelf zone ZE. In the example described above, the shelf groups G1 and G2 correspond to the first and second shelf groups.

As described in the foregoing, in the purge stocker 1, by performing the shelf-changing control, the empty shelf zone ZE is newly formed. Because all of the purge shelves 7A in the empty shelf zone ZE are empty, the need to supply purge gas to the purge shelves 7A can be eliminated. This allows the corresponding MFC 43 to reduce the flow rate of purge gas supplied to the purge shelves 7A included in the empty shelf zone ZE. Thus, with the purge stocker 1, the amount of purge gas can be reduced.

In the purge stocker 1, when two or more shelf zones Z each including a full shelf and an empty shelf are present and the total number of empty shelves included in these two or more shelf zones Z is equal to or larger than the predetermined shelf count, the stocker controller 50 determines that the number of empty shelves scattered in the purge stocker 1 is equal to or larger than the predetermined shelf count and performs the shelf-changing control. By this configuration, it can be effectively determined that the number of empty shelves scattered in the purge stocker 1 is equal to or larger than the predetermined shelf count.

In the purge stocker 1, the control unit 10 includes the purge controller 70 configured to control flow-rate adjustment of purge gas performed by each MFC 43. After having performed the shelf-changing control in the stocker controller 50, the purge controller 70 stops supplying purge gas to the purge shelves 7A included in the empty shelf zone ZE newly formed by this shelf-changing control. By this configuration, the amount of purge gas used can be further reduced.

In the purge stocker 1, the stocker controller 50 causes the crane 9 to load a storage container F, which is to be newly loaded, preferentially onto an empty shelf in a shelf zone Z including a full shelf among a plurality of shelf zones Z. By this configuration, the storage container F can be newly loaded such that empty shelves are less likely to be scattered in the purge stocker 1, and the shelf-changing control can be performed least frequently. Thus, the frequency with which the crane 9 is operated and, consequently, the frequency of maintenance can be reduced.

In the purge stocker 1, when the number of empty shelves scattered in the shelf group G2 is equal to or larger than the predetermined shelf count, the stocker controller 50 performs the intra-group shelf-changing control of causing the crane 9 to transfer a storage container F between a plurality of purge shelves 7A in the shelf group G2 such that the empty shelf zone ZE is newly formed in the shelf group G2. This allows movement of the crane 9 to be reduced more than when the storage container F is transferred between a plurality of shelf groups G. Thus, an increase of the maintenance frequency of the crane 9 due to excessive movement of the crane 9 can be prevented.

In the purge stocker 1, when the number of empty shelves scattered in the shelf groups G1 and G2 is equal to or larger than the predetermined shelf count, the stocker controller 50 performs the inter-group shelf-changing control of causing the crane 9 to transfer storage containers F from purge shelves 7A in the shelf group G2 to purge shelves 7A in the shelf group G1 such that the empty shelf zone ZE is newly formed in the shelf group G2. Thus, the empty shelf zone ZE can be formed more easily than when a storage container F is transferred between a plurality of purge shelves 7A in one shelf group G.

In the purge stocker 1, the stocker controller 50 performs the shelf-changing control when the number of empty shelves scattered in the purge stocker 1 is equal to or larger than the predetermined shelf count at at least any one execution start timing among specified date and time, time when a storage container F is unloaded, and time when an execution trigger is input by an operator. By this configuration, the shelf-changing control can be performed at effective timing.

Although one example has been described above, this disclosure is not limited to that example. In the example, various modifications can be made without departing from the scope of this disclosure.

In the example, the stocker controller 50 may change the shelf zones Z for a transfer destination of a storage container F in the shelf-changing control in a predetermined order. For example, the stocker controller 50 may change the shelf zones Z for a transfer destination of a storage container F in the shelf-changing control at regular time intervals to be selected among a plurality of shelf zones Z in ascending order of their serial numbers. Furthermore, for example, the stocker controller 50 may change the shelf zones Z for a transfer destination of a storage container F in the shelf-changing control at regular time intervals to be selected among the shelf zones Z in the order closer to the OHT port 21 and the manual port 23. By this configuration, some of the purge shelves 7A can be prevented from being more frequently used, and thus the frequency of maintenance operation can be reduced. In other words, imbalance in the usage rate among purge shelves 7A can be solved (the usage rate can be leveled), and the frequency with which some of the purge shelves 7A require maintenance work can be prevented from increasing.

In the example, the stocker controller 50 may select the shelf zone Z as a transfer destination of a storage container F in the shelf-changing control on the basis of operation input (operation input information) of the operator, which is input with the input device 80. In this example, in the shelf-changing control, the stocker controller 50 causes the crane 9 to transfer the storage container F to a purge shelf 7A as an empty shelf included in the selected shelf zone Z. By this configuration, the usage rates of the purge shelves 7A in the purge stocker 1 can be controlled.

In the example, the stocker controller 50 may change the shelf zone Z into which a storage container F is to be newly loaded to be automatically rotated among a plurality of shelf zones Z. By this configuration, imbalance in usage rate among purge shelves 7A can be solved, and the frequency with which some of the purge shelves 7A require maintenance work can be prevented from increasing.

In the example, the stocker controller 50 may select a shelf zone Z as a transfer destination of a storage container F and a shelf zone Z as a transfer source thereof in the shelf-changing control such that the number of conveyances by the crane 9 and the distance of the conveyances are minimized. By this configuration, movement of the crane 9 can be reduced. Thus, increase of the maintenance frequency of the crane 9 due to excessive movement of the crane 9 can be prevented.

In the example, in the inter-group shelf-changing control, the stocker controller 50 may select, as a shelf group G as a transfer source, a shelf group G the priority of which is lower than that of a shelf group G as a transfer destination. Similarly, in the inter-group shelf-changing control, the stocker controller 50 may select, as a shelf group G as a transfer destination, a shelf group G the priority of which is higher than that of a shelf group G as a transfer source. The priority can be appropriately set depending on various conditions.

In the example, the number of shelf groups G is not limited to a particular one, and only needs to be one or more. Similarly, the number of shelf zones Z is not limited to a particular one, and only needs to be two or more. The number of purge shelves 7A included in each shelf zone Z is not limited to a particular one, and only needs to be two or more.

The invention claimed is:

1. A purge stocker having a plurality of shelf zones each including a plurality of purge shelves each configured to purge inside of a storage container placed thereon with purge gas, the purge stocker comprising:
    a flow-rate adjuster configured to adjust a flow rate of the purge gas supplied to the purge shelves for each shelf zone;
    a conveying device configured to convey the storage container; and
    a controller configured to control conveyance of the storage container by the conveying device, wherein
    the controller,
        when the number of scattered empty shelves is equal to or larger than a predetermined shelf count that is the number of the purge shelves included in each shelf zone, performs a shelf-changing control of causing the conveying device to transfer the storage container such that an empty shelf zone in which all of the purge shelves included therein are empty is newly formed.

2. The purge stocker according to claim 1, wherein the controller,
    when two or more shelf zones each including a purge shelf on which a storage container has been already placed and an empty shelf are present and the total number of empty shelves included in these two or more shelf zones is equal to or larger than the predetermined shelf count, determines that the number of empty shelves scattered in the purge stocker is equal to or larger than the predetermined shelf count and performs the shelf-changing control.

3. The purge stocker according to claim 1, wherein the controller, after having performed the shelf-changing control, stops supplying the purge gas to the purge shelves included in the empty shelf zone newly formed by this shelf-changing control.

4. The purge stocker according to claim 1, wherein
    the controller
        selects, based on operation input of an operator, one of the shelf zones as a transfer destination of the storage container in the shelf-changing control, and
        causes, in the shelf-changing control, the conveying device to transfer the storage container to a purge shelf included in the shelf zone selected.

5. The purge stocker according to claim 1, wherein the controller changes the shelf zones for a transfer destination of the storage container in the shelf-changing control in a predetermined order.

6. The purge stocker according to claim 1, wherein the controller causes the conveying device to load a storage container, which is to be newly loaded, preferentially onto an empty shelf in a shelf zone including a purge shelf on which a storage container has been already placed among the shelf zones.

7. The purge stocker according to claim 1, further comprising a plurality of shelf groups each including a plurality of the shelf zones adjacent to one another, wherein
    the controller,
        when the number of empty shelves scattered in one certain shelf group among the shelf groups is equal to or larger than the predetermined shelf count, causes the conveying device to transfer the storage container between a plurality of purge shelves in this one shelf group such that the empty shelf zone is newly formed in this one shelf group.

8. The purge stocker according to claim 1, further comprising a plurality of shelf groups each including a plurality of the shelf zones adjacent to one another, wherein
    the controller,
        when the number of empty shelves scattered in first and second shelf groups that are two certain shelf groups among the shelf groups is equal to or larger than the predetermined shelf count, causes the conveying device to transfer the storage container from a purge shelf in either one of the first and second shelf groups to a purge shelf in the other thereof such that the empty shelf zone is newly formed in the either one of the first and second shelf groups.

9. The purge stocker according to claim 1, wherein the controller performs the shelf-changing control when the number of empty shelves scattered in the purge stocker is equal to or larger than the predetermined shelf count at at least any one execution start timing among specified date and time, time when the storage container is unloaded, and time when an execution trigger is input by an operator.

* * * * *